US009563317B2

(12) United States Patent
Sleeman et al.

(10) Patent No.: US 9,563,317 B2
(45) Date of Patent: Feb. 7, 2017

(54) CAPACITIVE CONTROL PANEL

(71) Applicant: Atmel Corporation, San Jose, CA (US)

(72) Inventors: Peter Sleeman, Waterlooville (GB); Samuel Brunet, Cowes (GB); Esat Yilmaz, Santa Cruz, CA (US)

(73) Assignee: Atmel Corporation, San Jose, CA (US)

( * ) Notice: Subject to any disclaimer, the term of this patent is extended or adjusted under 35 U.S.C. 154(b) by 190 days.

(21) Appl. No.: 14/278,864

(22) Filed: May 15, 2014

(65) Prior Publication Data

US 2014/0333579 A1 Nov. 13, 2014

Related U.S. Application Data

(63) Continuation of application No. 12/554,552, filed on Sep. 4, 2009, now Pat. No. 8,730,199.

(51) Int. Cl.
*G06F 3/041* (2006.01)
*G06F 3/044* (2006.01)
(Continued)

(52) U.S. Cl.
CPC ............ *G06F 3/044* (2013.01); *G01L 1/146* (2013.01); *G06F 3/0202* (2013.01);
(Continued)

(58) Field of Classification Search
None
See application file for complete search history.

(56) References Cited

U.S. PATENT DOCUMENTS 5,730,165 A 3/1998 Philipp
6,452,514 B1 9/2002 Philipp
(Continued)

FOREIGN PATENT DOCUMENTS

CN 1791788 A 6/2006
TW 200417967 9/2004
(Continued)

OTHER PUBLICATIONS

USPTO Issue Notification, date mailed Apr. 30, 2014.
(Continued)

*Primary Examiner* — Joseph Haley
*Assistant Examiner* — Ifedayo Iluyomade
(74) *Attorney, Agent, or Firm* — Baker Botts L.L.P.

(57) ABSTRACT

A control panel for proximity and force sensing, includes a cover layer, a first electrode layer including a first force sensor electrode, a second force sensor electrode positioned in a second electrode layer or on a support layer, and a dielectric substrate at least a portion of which is compressible and is positioned between the first and second force sensor electrodes. The support layer is positioned to support at the vicinity of the second force sensor electrode support location so that compression of the dielectric substrate and the separation of the first and second force sensor electrodes depends on the magnitude of a force applied to the cover layer. Touch sensor electrodes are positioned on one or more of the electrode layers such that their capacitance depends on proximity of an object such as a finger. Controllers measure the capacitance of the force and touch sensor electrodes respectively and output force and touch proximity signals.

20 Claims, 8 Drawing Sheets

(51) Int. Cl.
  *G01L 1/14* (2006.01)
  *G06F 3/02* (2006.01)
  *H03K 17/975* (2006.01)

(52) U.S. Cl.
  CPC ......... *G06F 3/0414* (2013.01); *H03K 17/975* (2013.01); *G06F 2203/04103* (2013.01); *G06F 2203/04106* (2013.01); *Y10T 29/4913* (2015.01)

(56) References Cited

U.S. PATENT DOCUMENTS

| | | |
|---|---|---|
| 6,466,036 B1 | 10/2002 | Philipp |
| 7,148,882 B2 | 12/2006 | Kamrath |
| 7,343,813 B1 | 3/2008 | Harrington |
| 7,663,607 B2 | 2/2010 | Hotelling |
| 7,875,814 B2 | 1/2011 | Chen |
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 8,730,199 B2 * | 5/2014 | Sleeman ................. G01L 1/146 345/173 |
| 2004/0227736 A1 | 11/2004 | Kamrath et al. |
| 2007/0229464 A1 | 10/2007 | Hotelling et al. |
| 2009/0201246 A1 | 8/2009 | Lee et al. |
| 2009/0231305 A1 | 9/2009 | Hotelling |
| 2009/0315854 A1 | 12/2009 | Matsuo |
| 2010/0050784 A1 | 3/2010 | Joung |
| 2011/0012869 A1 | 1/2011 | Klinghult |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

FOREIGN PATENT DOCUMENTS

| | | |
|---|---|---|
| TW | 363021 | 8/2009 |
| WO | WO 2012/129247 | 9/2012 |

OTHER PUBLICATIONS

USPTO Notice of Allowance and Fee(s) Due, notification date: Jan. 3, 2014.
Sleeman, et al., U.S. Appl. No. 12/554,552, Amendment Response after Non-Final Office Action, dated Sep. 9, 2013.
Sleeman, at al., U.S. Appl. No. 12/554,552, filed Sep. 4, 2009, USPTO Non-Final Office Action, notification date: Jun. 7, 2013.
Sleeman, et al., U.S. Appl. No. 12/554,552, Request for Continued Examination (RCE) and Amendment Response, dated May 7, 2013.
Sleeman, et al., U.S. Appl. No. 12/554,552, filed Sep. 4, 2009, USPTO Final Office Action, notification date: Dec. 7, 2012.
Sleeman, et al., U.S. Appl. No. 12/554,552, Amendment Response after Non-Final Office Action, dated Aug. 10, 2012.
Sleeman, at al., U.S. Appl. No. 12/554,552, filed Sep. 4, 2009, USPTO Non-Final Office Action, notification date: May 10, 2012.
Sleeman, et al., U.S. Appl. No. 12/554,552, Amendment Response to Office Action Containing Election of Species Requirement, dated Apr. 19, 2012.
Sleeman, et al., U.S. Appl. No. 12/554,552, filed Sep. 4, 2009, USPTO Non-Final Office Action/Election Restriction, notification date: Mar. 19, 2012.
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
First Office Action Issued by the State Intellectual Property Office of China for Application No. 201010275716.4 (translation attached), date of issuance Jan. 6, 2014.
Taiwanese Office Action Issued by IPO regarding Patent Application No. 099129310 issued Apr. 29, 2015.
Taiwanese Office Action Issued by IPO regarding Patent Application No. 099129310 issued Apr. 29, 2015 (English translation only.).

* cited by examiner

CAPACITIVE CONTROL PANEL

RELATED APPLICATIONS

This application is a continuation, under 35 U.S.C. §120, of U.S. patent application Ser. No. 12/554,552, filed Sep. 4, 2009, entitled Capacitive Control Panel, which is incorporated herein by reference.

BACKGROUND

The invention relates to capacitive control panels. More particularly the invention relates to capacitive control panels incorporating touch sensitive and force sensitive input means.

There is an increasing demand for robust and aesthetically pleasing control panels (user interfaces) for controlling devices. Over recent years capacitive sensing techniques have become well established and accepted in this field. Common examples of devices that include capacitive control panels are touch-sensitive display screens and touch-sensitive keyboards keypads, e.g., as used for controlling consumer electronic devices/domestic appliances.

It is known for capacitive control panels to include both touch sensitive inputs (e.g., capacitive position sensors) and force sensitive inputs (e.g., conventional push buttons/switches). For example, versions of the "iPod mini" manufactured by Apple Computer Inc, have a touch sensitive scroll wheel overlaying a number of mechanical switches.

FIG. 1 schematically shows a section view of a control panel 2 of this general type. The control panel 2 is mounted in a wall 4 of a device to be controlled. The control panel includes a capacitive touch sensing element 6 in the form of a ring perpendicular to the plane of FIG. 1, and a number of conventional mechanical switches 8. Two of the switches 8 are apparent in the cross-section view of FIG. 1. The capacitive sensor 6 and mechanical switches 8 are coupled to appropriate control circuitry (not shown).

The capacitive position sensing element 6 is formed on a printed circuit hoard (PCB) acting as a structural platform 10. The platform PCB 10 and the capacitive sensing element 6 are covered by an outer protective layer 14. The platform PCB 10 is tiltably mounted on a central support 12 so that it can move within an opening in the wall 4 of the device. The support 12 is attached to a base PCB 16. The base PCB 16 and the wall 4 are fixed together. The position of a user's finger touching the sensing element 6 is determined by the capacitive sensor control circuitry and used to control the device accordingly.

The mechanical switches 8 are mounted on the base PCB 16 beneath the capacitive position sensing element 6. Each mechanical switch 8 comprises a deformable diaphragm 8B disposed over a central electrode 8A. Each diaphragm extends away from the base PCB 6 to a height at which it just touches the underside of the platform PCB 10. Switching action is achieved by deforming a selected diaphragm so that it contacts the central electrode 8A. This is done by pressing down on the capacitive position sensing element above the desired switch. This causes the platform PCB 10 to tilt about its central support 12 and compress the diaphragm of the selected switch to bring it into contact with its central electrode.

A user may thus provide control instructions through appropriate use of the capacitive position sensing element 6 and the mechanical switches 8 in accordance with the controlled device's means of operation.

The control panel 2 shown in FIG. 1 provides a compact and intuitive user interface, but has a number of shortcomings. For example, the use of conventional push switches means that the control panel only has binary sensitivity to mechanical force input. That is to say the control panel can only indicate whether or not a switch is open or closed. There is no analogue sensitivity to the magnitude of force applied. This restricts the flexibility of the control panel to respond in different ways to different forces. Furthermore, the overall structure is relativity complex and the use of two different sensing techniques (i.e., conventional switches for mechanical force sensing and capacitive sensing techniques for touch sensing) means the required complexity of the control circuitry is increased since it has to be able to accommodate both types of sensor.

Force sensors based on capacitive sensing techniques are known. FIGS. 2A and 2B schematically section views of one such capacitive force sensor 20. The force sensor 20 is mounted on a base 22 and comprises a lower electrode 26 and an upper electrode 28. The lower and upper electrodes are separated by a compressible dielectric material 24 and connected to capacitance measurement circuit 21. The capacitance between the lower and upper electrodes 26, 28 as measured by the capacitance measurement circuit 21 depends on the magnitude of their separation.

FIG. 2A shows the force sensor 20 in relaxed state (no force applied) and FIG. 2B shows the force sensor 20 with a perpendicular force F applied. The force compresses the dielectric material 24, and thus brings the lower and upper electrodes 26, 28 closer together. This registers as a change in their mutual capacitance measured by the capacitance measurement circuit 21. The extent to which the dielectric material 24 is compressed (and hence the change in separation between the electrodes 26, 28) depends on the magnitude of the force F. Accordingly, the output from the capacitance measurement circuit 21 provides a measurement of the force F applied.

Sensors of the kind shown in FIGS. 2A and 2B may be used in various ways, for example in feedback circuits of robotic gripping hands, or as air pressure monitors in automobile tires. However, a problem with incorporating such force sensors into control panels/user interfaces is that as well as being sensitive to directly applied forces, such sensors win also be sensitive to changes in capacitance caused by nearby pointing objects, such as a user's finger, even when not pressing on the sensor (in the same way that conventional capacitive sensors respond to proximate objects).

BRIEF DESCRIPTION OF THE DRAWINGS

For a better understanding of various embodiments and to show how the same may be carried into effect reference is now made by way of example to the accompanying drawings in which.

DETAILED DESCRIPTION

Figure 1:
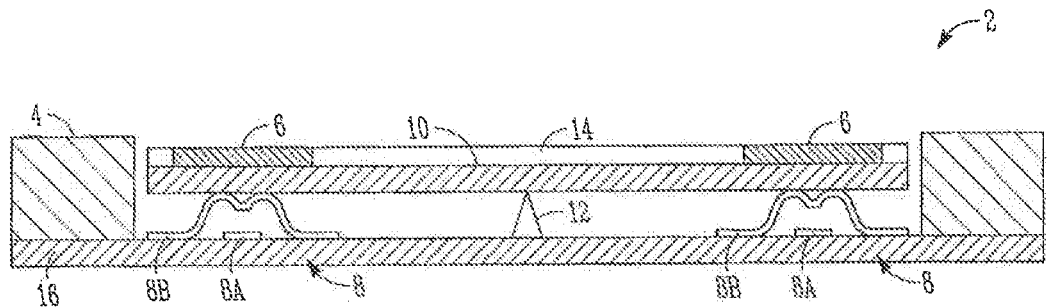
FIG. 1 schematically shows in section view a known control panel incorporating a capacitive touch sensor and mechanical push switches.
Figure 2A:
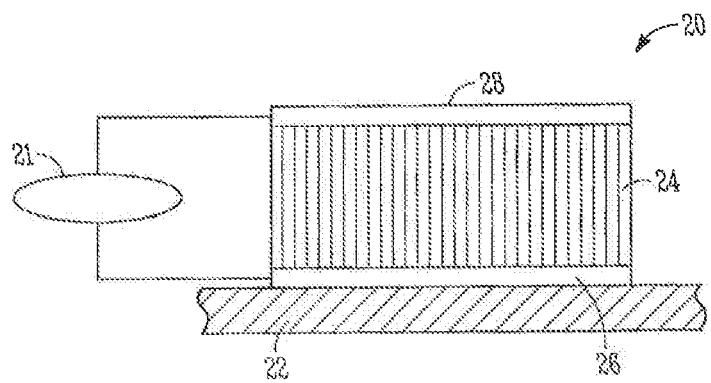
FIGS. 2A and 2B schematically show a known capacitive force sensor respective relaxed and squashed states.
Figure 2B:
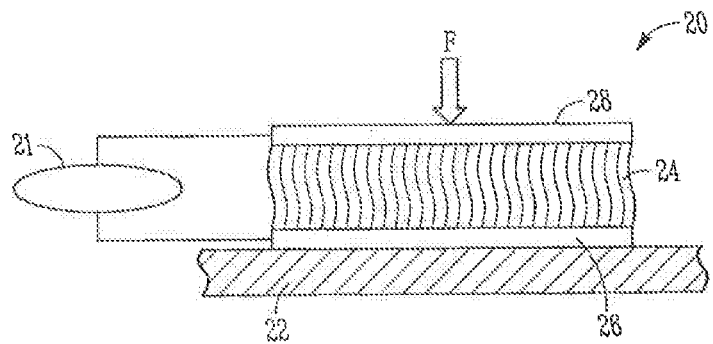

Control panels are provided which have touch sensors responsive to proximity of an object such as a finger and a force sensor responsive to a force applied by the object. Both the proximity and force sensors may use capacitive sensing, with respective sensor electrodes. Electrodes for the touch sensors are separated by a deformable or compressible dielectric and supported such that a applied force causes changes in separation and corresponding changes in capacitance of the touch sensor electrodes.

Capacitive sensing techniques may be considered broadly to fall into two categories, namely those based on measuring the self-capacitance of an electrode (sometimes referred to as passive capacitive sensing techniques), and those based on measuring the mutual-capacitance between electrodes; (sometimes referred to as active capacitive sensing techniques).

Self-capacitance capacitive sensing devices rely on measuring the capacitance of a sensing electrode to a system reference potential (earth/ground). In broad summary, self-capacitance capacitive sensors employ sensing electrodes coupled to capacitance measurement circuits. Each capacitance measurement circuit measures the capacitance (capacitive coupling) of an associated sensing electrode to a system reference potential (e.g., a system ground). When there is no pointing object near to the sensing electrode, the measured capacitance has a background quiescent value. This value depends on the geometry and layout of the sensing electrode and the connection leads to it, and so on, as well as the nature and location of neighbouring objects, e.g., the sensing electrodes proximity to nearby ground planes. When a pointing object e.g., a user's finger, approaches the sensing electrode, the pointing object acts as a virtual ground in proximity to the sensing electrode. This serves to increase the measured capacitance of the sensing electrode to ground. Thus an increase in measured capacitance is taken to indicate the presence of a pointing object. These principles may be directed to discrete (single button) measurements and to two-dimensional position sensitive capacitive sensors. For example, a plurality of electrodes may be arranged on a surface to provide electrodes that define either an array of discrete sensing areas, or rows and columns of electrodes in a pollable matrix configuration.

Mutual-capacitance capacitive sensors differ from self-capacitance sensors in that they are based on measuring the capacitive coupling between two electrodes (rather than between a single sensing electrode and a system reference potential). One electrode in the pair is commonly referred to as the drive (or transmit) electrode, while the other electrode is commonly referred to as the sense (or receive) electrode. The drive electrodes are also sometimes referred to as X-electrodes and the sense electrodes as NT-electrodes. This historically relates to the orientation of the different electrodes in some early examples of the mutual-capacitance capacitive sensors. However, the terms are sometimes still used today to distinguish the driven and sense electrodes regardless of their orientation.

In a basic mutual-capacitance type capacitive sensor, the drive electrode is supplied with an oscillating drive signal (e.g., comprising one or more square wave logic-level pulses). The mutual capacitance between the drive and sense electrodes is determined by the extent to which a component of the drive signal is capacitively coupled to the sense electrode. The degree of coupling of the drive signal to the sense electrode is determined by measuring the amount of charge transferred to the sense electrode by the oscillating drive signal.

Figure 3A:
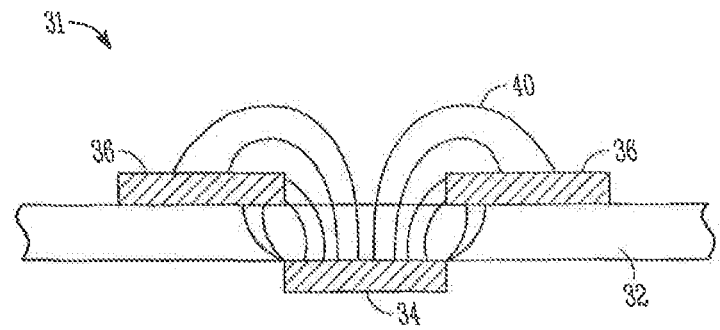
FIGS. 3A and 3B schematically show a section view of a capacitive sensor employed in embodiments with a representation of overlying electric field lines when no pointing object is adjacent the sensor and when a pointing object is adjacent the sensor, respectively.
Figure 3B:
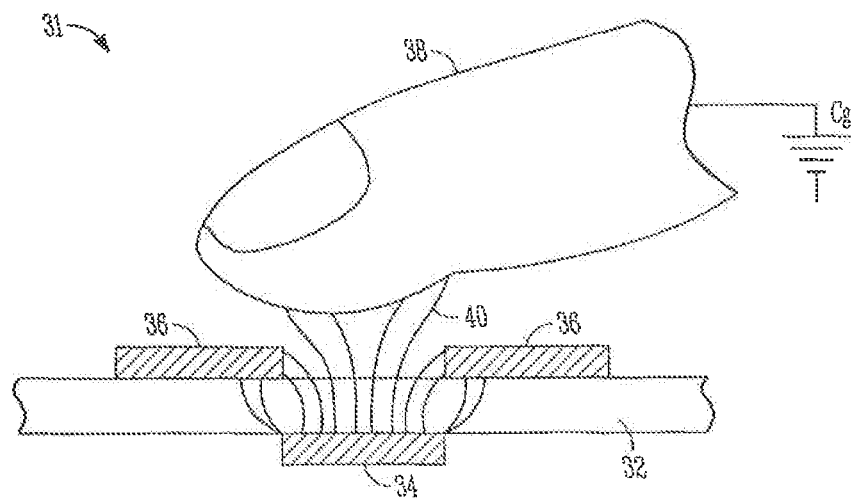

FIGS. 3A and 3B schematically show section views of a region of a mutual-capacitance type capacitive sensor 31 that may be used in accordance with some embodiments. The sensor 31 comprises a dielectric substrate 32 having a drive electrode 34 mounted on its lower surface (referring to the orientation in the figures) and a sense electrode 36 mounted on its upper surface. The drive electrode 34 in this example is in the form of a closed circle and the sense electrode 36 is in the form of a ring having a central opening broadly aligning with the drive electrode. In this example the sensor provides a single discrete circular touch sensitive area, but the same general principles apply to other types of sensors based on mutual capacitance sensing techniques, e.g., those for providing continuous position estimates for a proximate object within a sensing area.

Also shown in FIGS. 3A and 3B are schematic representations of electric field lines connecting between the drive and sense electrode as a result of a drive signal applied to the drive electrode. In effect the lines 40 provide a highly schematic pictorial representation of the capacitive coupling between the drive and sense electrodes. FIG. 3A schematically shows the electric fields when there is no object adjacent the sensor 31. FIG. 3B schematically shows the electric fields when there is an object adjacent the sensor (i.e., user's finger 38 having a capacitance $C_g$ to ground).

When there is no object adjacent the sensor (FIG. 3A), all the electric field lines represented in the figure connect between the driven electrode 34 and the sense electrode 36. However, when the user's finger 38 is adjacent the sensor (FIG. 3B), some of the electric field lines that pass outside of the substrate are coupled to ground through the finger. Thus fewer field lines connect between the drive and sense electrodes, and the measured capacitive coupling between them is accordingly reduced.

Thus measured changes in the amount of charge coupled between the drive electrode 34 and the sense electrode 36 can be used to determine if an object is adjacent the sensor (i.e., whether the electrical properties of the region into which the spilled electric fields extend have changed). This is a broad summary of the basic principles underlying mutual-capacitance capacitive sensing techniques.

Figure 4:
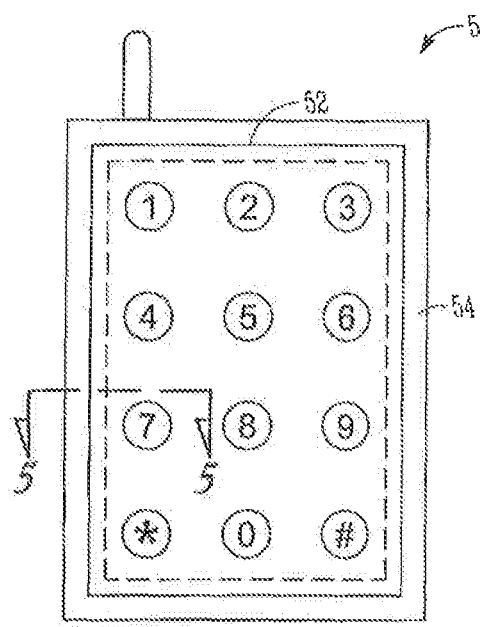
FIG. 4 schematically shows a device incorporating a capacitive sensor according to an embodiment.

FIG. 4 schematically shows a device 50 according to an embodiment. The device 50 comprises a housing 54 and a control panel 52 that provides sensitivity to touch and sensitivity to force/pressure. In this example the device 50 is a mobile (cellular) telephone, but embodiments are equally applicable to any type of device/apparatus having a control panel interface.

Figure 5:
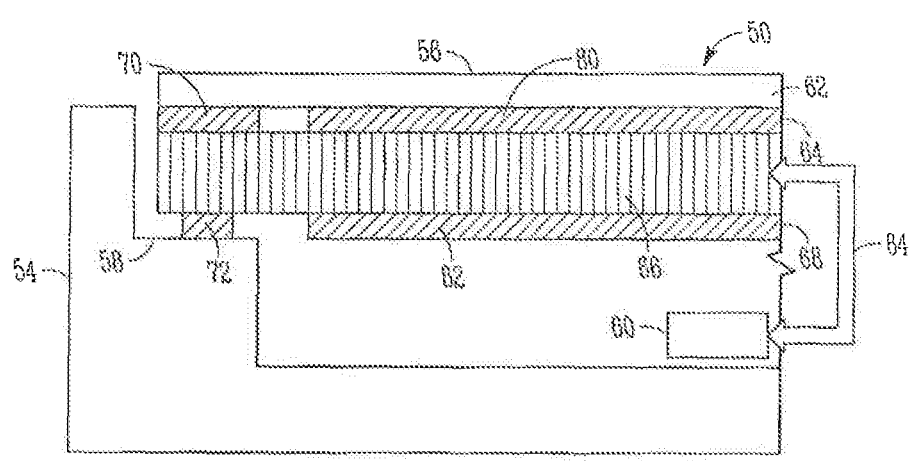
FIG. 5 schematically shows a partial section view of the device shown in FIG. 4.

FIG. 5 schematically shows a partial section view; of the device 50 of FIG. 4 taken along 5-5 (not to scale). The control panel 52 comprises a sensing element portion 56, a support structure portion 58 and a controller 60.

The sensing element 56 comprises a layered structure with layers stacked in the order of a cover layer 62, a first electrode layer 64 comprising a first force sensor electrode 70 and a first touch sensor electrode 80, a compressible dielectric substrate 66, and a second electrode layer 68 comprising a second force sensor electrode 72 and a second touch sensor electrode 82. The first and second electrode layers may be conductive material mounted directly to the dielectric substrate to define the respective electrodes. Alternatively the first and second electrode layers may be respective first and second mounting sheets with conductive material mounted thereon to define the respective electrodes. In this example the cover panel 62 is a transparent acrylic sheet with a thickness of around 1 mm, the first and second electrode layers comprise respective transparent plastic sheets, e.g., formed of Polyethylene terephthalate (PET), on to which a transparent conductor, e.g., indium tin oxide (ITO) is deposited to define the first and second force- and touch-sensor electrodes using conventional fabrication techniques. The cover panel is bonded to the other Byers using, e.g., adhesive.

The compressible substrate may be a layer of optical silicone jelly, e.g., having a thickness in the region of around 100 to 250 microns with the first and second electrode layers bonded thereto using transparent adhesive. Thus the sensing element 56 of the force- and touch-sensor control panel 52 of this example is transparent and may overlay a display screen (not shown in FIG. 4) in accordance with the general principles of touch screen techniques. Alternatively, or in addition, the dielectric substrate may include a layer of compressible adhesive.

The support structure 58 in this example is provided by a lip in a housing of the device 50, e.g., a conventional molded plastic housing. The support structure 58 is arranged to support the sensing dement 56 at a support location in the vicinity of the second force sensor electrode 72 on the underside of the sensing element, The lip in this example: is arranged to support the sensing element near its periphery and around its full perimeter. Peripheral mounting also allows, for example, a display screen to be mounted behind the sensing element without obscuration by the support structure. In this example the sensing element is bonded to the support structure, e.g., using adhesive, at the support location. The first 70 and second 72 force sensor electrodes are aligned with the support location such that their separation depends on the magnitude of a force applied to the cover layer (i.e., a force which compresses the dielectric substrate).

The controller 60 comprises capacitive drive and sense channels operating in accordance with in this example, conventional mutual-capacitance techniques for capacitance measurement. The drive and sense channels are coupled to their respective electrodes of the sensing element in accordance with conventional techniques, e.g., using flexible edge connectors ribbons and on board traces, as schematically indicated in FIG. 5 by block arrow 84.

The controller thus comprises a first drive channel, which may be referred to as a force sensor drive channel, coupled to the first force sensor electrode, which may thus be referred to as a force sensor drive electrode. The controller further comprises a first sense channel, which may be referred to as a force sensor sense channel, coupled to the second force sensor electrode, which may thus be referred to as a force sensor sense electrode, The controller further comprises a second drive channel, which may be referred to as a touch sensor drive channel, coupled to the second touch sensor electrode, which may thus be referred to as a force sensor drive electrode. The controller further comprises a second sense channel, which may be referred to as a touch sensor sense channel, coupled to the first touch sensor electrode, and which may thus be referred to as a touch sensor sense electrode.

Thus the controller 60 is operable to measure the mutual capacitance between the two force sensor electrodes using the force sensor drive and sense channels, and is operable to measure the mutual capacitance between the two touch sensor electrodes using the touch sensor drive and sense channels, in accordance with known capacitive sensing techniques. As described further below, the two force sensor electrodes 70, 72 (with associated elements) provide for a force sensor a sensor that is sensitive to mechanical force/pressure applied to the cover panel 62, e.g., by a pressing finger). The two touch sensor electrodes 80, 82 (with associated elements), on the other hand, provide for a touch sensor (i.e., a sensor that is sensitive to proximity of an object, e.g., a pointing finger). Significantly, the same capacitive sensing technology may be used for both the force sensor and the touch sensor. This simplifies the complexity of the control panel.

In addition (and unlike the touch sensor), the force sensor is arranged with its driven electrode on the cover panel side of the substrate (i.e., the side from which a pointing/pressing object will approach in normal use). This provides the force sensor with reduced sensitivity to the proximity of an approaching object.

Furthermore still, the sensing element 56 is supported in the vicinity of the second force sensor electrode 72, but not in the vicinity of the second touch sense electrode. This means the dielectric substrate in the touch sensitive region of the control panel (as defined by the arrangement of the touch electrodes) is not compressed when force is applied to the cover panel. Thus the touch sensor output has reduced dependence on the magnitude of any force applied then would otherwise be the case.

The functionality of the controller 60 may be provided by a single integrated circuit chip, for example a suitably programmed general purpose microprocessor, field programmable gate array, or application specific integrated circuit, for example, or may be provided by discrete componentry.

In principle the touch sensor aspect of a control panel may comprise a single discrete touch sensitive "button" provided by as single touch sensor drive electrode and a single touch sensor sense electrode which are arranged with respect to one another in accordance with conventional techniques so that a pointing object in the vicinity of the sense electrode modifies the measured capacitance between them, e.g., as schematically represented in FIGS. 3A and 3B. In practice, however, a control panel in accordance with embodiments of the invention may often have multiple touch sensor drive electrodes and multiple touch sensor sense electrodes coupled to respective multiple capacitive drive and sense channels. The specific design of the touch sensor, e.g., its detailed electrode patterning, is not overly significant, and any known design of capacitive touch sensor electrode patterning may be used. Thus while FIG. 5 is drawn and described above in the context of a touch sensor aspect of the control panel which is based on a single touch sensor drive electrode and a single touch sensor sense electrode for simplicity, it will be appreciated in practice more complex touch sensor electrode patterns are employed, e.g., in accordance with the known principles of capacitive touch sensor technologies.

Figure 6A:
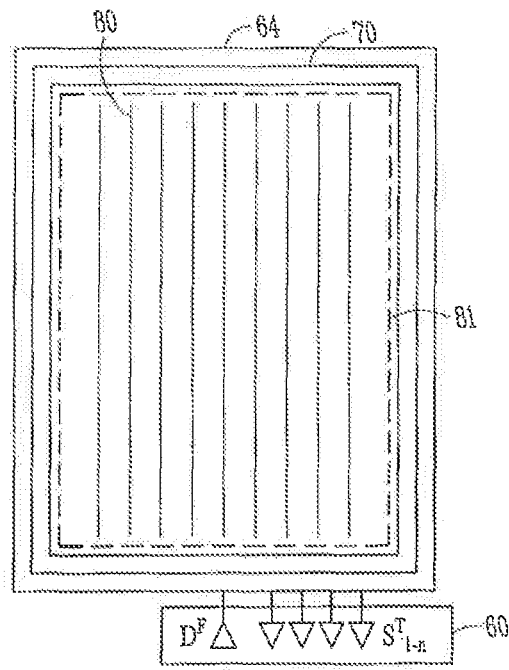
FIGS. 6A and 6B schematically show electrode patterns on first and second sides of the capacitive sensor incorporated into the device shown in FIGS. 4 and 5.
Figure 6B:
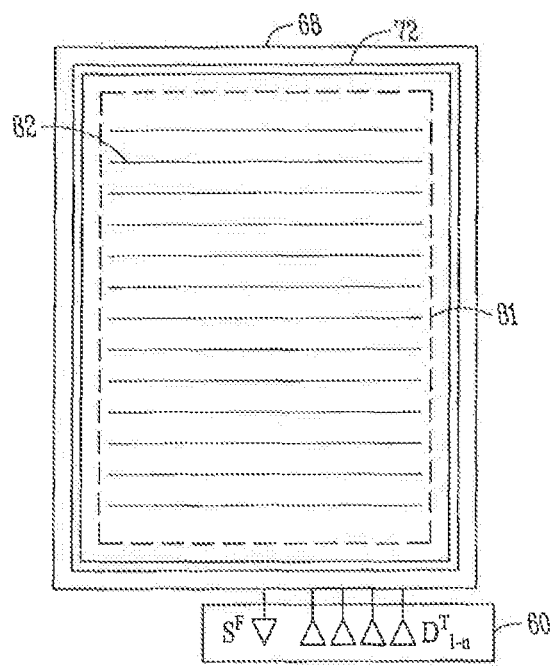

FIGS. 6A and 6B schematically show the first electrode layer 64 and the second electrode layer 68 of the control panel 52 shown in FIG. 5. Some aspects of the controller 60 are also represented in these figures.

As shown in FIG. 6A, the sensing element in this example is generally rectangular, although its specific shape is not significant. The first (drive) force sensor electrode 70 is in a closed loop pattern generally towards the periphery of the sensing element. A touch sensitive region (indicated generally by a dashed line 81) is defined by a plurality of touch sensor sense electrodes 80 (of which a single example is shown for FIG. 5) arranged in accordance with any known design. The first (drive) force sensor electrode 70 is coupled to a drive channel $D^F$ in the controller 60. The plurality of touch sensor sense electrodes 80 are coupled to a corresponding plurality of sense channels $S^T$.

As shown in FIG. 6B, the second electrode layer 68 disposed towards the underside of the sensing element (relative to the direction of an approaching object) matches the general size and shape; of the first electrode layer 64. The second (sense) force sensor electrode 72 is broadly similar to the overlying first (drive) force sensor electrode 70 on the first electrode layer 64 in that in this example it is in the form of a closed loop generally towards the periphery of the sensing element. The first and second force sensor electrodes are arranged within their respective electrode layers so that the first force sensor electrode 70 overlies the second force sensor electrode 72 when viewed from the direction of the cover panel 62. In this example the first force sensor electrode 70 fully covers the second force sensor electrode 72 in that the second force sensor electrode 72 is thinner in cross-section than the first force sensor electrode 70 and is fully behind it (as schematically indicated in FIG. 5). The second electrode layer 68 comprises a plurality of touch sensor drive electrodes 82. (of which only a single example is shown in FIG. 5). These are arranged in accordance with any known design to cooperate with the touch sensor sense electrodes 80 on the first electrode layer 64 to provide the touch sensor functionality of the control panel 52 in accordance with conventional capacitive touch sensing techniques. As previously noted, embodiments may be used with any known design of electrodes for providing touch sensitive functionality in a capacitive sensor. Purely for example a simple matrix design is schematically represented in FIGS. 6A and GB.

As indicated in FIG. 6B, the second (sense) force sensor electrode 72 is coupled to a sense channel $S^F$ in the controller 60. The plurality of touch sensor drive electrodes 82 are coupled to a corresponding plurality of capacitive drive channels $D^T$.

Thus in use the controlled is operable to measure the mutual capacitive coupling between the force sensor electrodes 70, 72, and to generate a corresponding force sensor output signal based on the measured capacitance. The controller is also operable to measure the mutual capacitive couplings between respective touch sensor electrodes 80, 82, and to generate corresponding touch sensor output signals based on the measured capacitances in the usual way. To avoid possible interference between measurements, the controller may be operable to measure the mutual capacitive coupling between the force sensor electrodes 70, 72 and the mutual capacitive couplings between respective touch sensor electrodes 80, 82 at different times.

Figure 7:
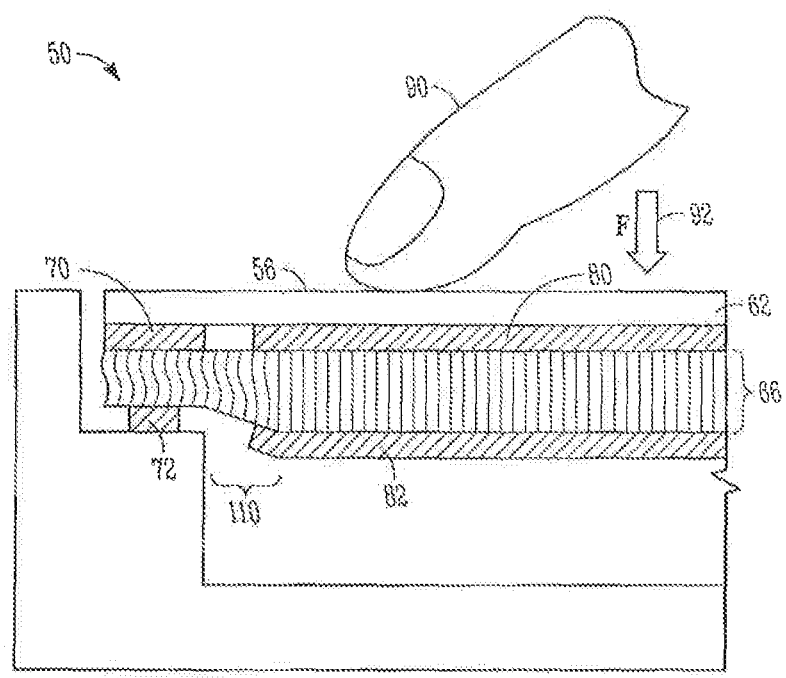
FIG. 7 schematically shows a partial section view of the device shown in FIG. 4 under load from a finger pressing on the capacitive sensor of the device.

FIG. 7 schematically shows in cross-section another view of the control panel 52 of FIGS. 4 and 5. (The controller 60 is not shown in FIG. 7 for simplicity). FIG. 7 differs from FIG. 5 in that FIG. 7 shows the control panel 52 in a state in which a pointing object 90 (here a user's finger) is applying a pressing force F to the cover panel 62, as schematically indicated by downward arrow 92. The pressing force F acts to compress the dielectric substrate 66 in the region between the force sensor electrodes 70, 72, The force F does not compress the dielectric substrate 66 in the region between the touch sensor electrodes 80, 82 because there is no mechanical support of the sensing element at these locations to provide a reaction force for the applied force F to press against.

Because the dielectric substrate between the force sensor electrodes is compressed, the force sensor electrodes move closer together. Because the mutual capacitance of the electrodes is dependent on their separation, the output signal from the force sensor sense channel coupled to the second force sensor electrode changes. The separation between the force sensor electrodes, and hence their measured capacitance, will depend on the magnitude of the force applied (at least to a limit at which the dielectric substrate is fully compressed). Thus the capacitance measurement provided by the controller may be output as a signal indicative of the magnitude of force applied.

However, because the dielectric substrate between the touch sensor electrodes (i.e., in the touch sensing region of the control panel) is not compressed by the applied force, the touch sensor functionality of the control panel operates in the same way regardless of the applied force F. Thus the capacitance measurement functionality (i.e., drive and sense channel) provided by the controller in association with the touch sensor electrodes may continue to operate to output a signal indicative of the touch of the object as a touch sensor output signal. The nature of the touch sensor output signal will depend on the nature of the design of the electrodes associated with the touch sensor functionality in the usual way, e.g., the touch sensor output signal may comprise an estimated position of a touch, or merely an indication of the presence of an object in proximity to one or more discrete touch sensing areas with the overall touch sensor.

Accordingly, the control panel of FIGS. 4 to 7 provides both touch sensor functionality and force sensor functionality. Furthermore the design incorporates various features which help improve the independence of touch and force measurements. As already noted above, the lack of structural support for the sensing element beneath the touch sensitive region (as defined by the touch sensor electrodes) means the touch sensor functionality is largely independent of the application of a force F. In some embodiments, the dependence of the force sensor output signal on the mere proximity of an object to the force sensor electrode may be reduced (i.e., an object that is near to the electrodes, but not applying a force). This is to avoid "false" determinations of a force being applied.

Reduced sensitivity of the force sensor function of the control panel to proximate, but non-pressing objects, may be achieved in the embodiment shown in FIGS. 4 to 7 through the relative arrangement of the force sensor electrodes and their drive and sense channels.

In particular, because the first force sensor electrode 70 is the driven electrode of the capacitive force sensor electrodes, and is located on the objectfacing side of the sensing element during normal use. the effects of the capacitance of the second sense electrode 72 to objects above the cover panel are reduced through shielding by the larger first force sensor electrode 70. This helps reduce the sensitivity of the capacitance measured by the sense channel $S^F$ coupled to the second force sensor electrode 72 to objects approaching the cover panel 62 in the vicinity of the force sensor electrodes which are not pressing on it.

Furthermore, as noted above, from the perspective of an object approaching the cover panel, the second force sensor electrode 72 in this example is fully underneath the first force sensor electrode 70, and has a smaller areal extent. The significance of this is that the mutual capacitive coupling between the force sensor drive electrode 70 on the first electrode layer 64 and the force sensor sense electrode 72 on the second electrode layer 68 is primarily within a region of the dielectric substrate 66 between the two electrodes v:ith little "overspill", Thus the use of the thinner second force sensor electrode 72 tends to focus the electric field coupling from the driven first force sensor electrode to the second force sensor electrodes into a region between them, with relatively little "spill over" of electric fields into the cover panel and beyond. Thus the arrangement of the driven force sensor electrode 70 being larger than the underlying sensing force sensor electrode 72 focuses the mutual capacitive coupling between them to further reduce sensitivity to objects above the cover panel in the vicinity of the force sensor electrodes 70, 72, This is because relatively little coupling between the force sensor electrodes occurs in this region above the cover panel, and so the presence of an object here has a reduced effect on the measured mutual capacitance. The inventors have also found that using a relatively thin conductor for the sense electrode can act to increase the relative significance of so-called fringe-field effects, and so increase the sensitivity of the capacitive force sensor to changes in electrode separation.

Thus a control panel may be provided that provides a force sensor output signal indicative of the magnitude of an applied force, but with reduced sensitivity to the mere presence of proximate objects, and a touch sensor output signal indicative of the proximity of an object, but with reduced sensitivity to any force applied by the object. Furthermore, the force and touch sensor functionality may be provided in a relatively simple design that can employ the same sensing technology for both types of sensor. The same control circuitry may be used (i.e., conventional capacitive measurement circuitry) for each type of sensor, and furthermore, the same types of structural elements for the two types of sensor may be used.

Figure 8:
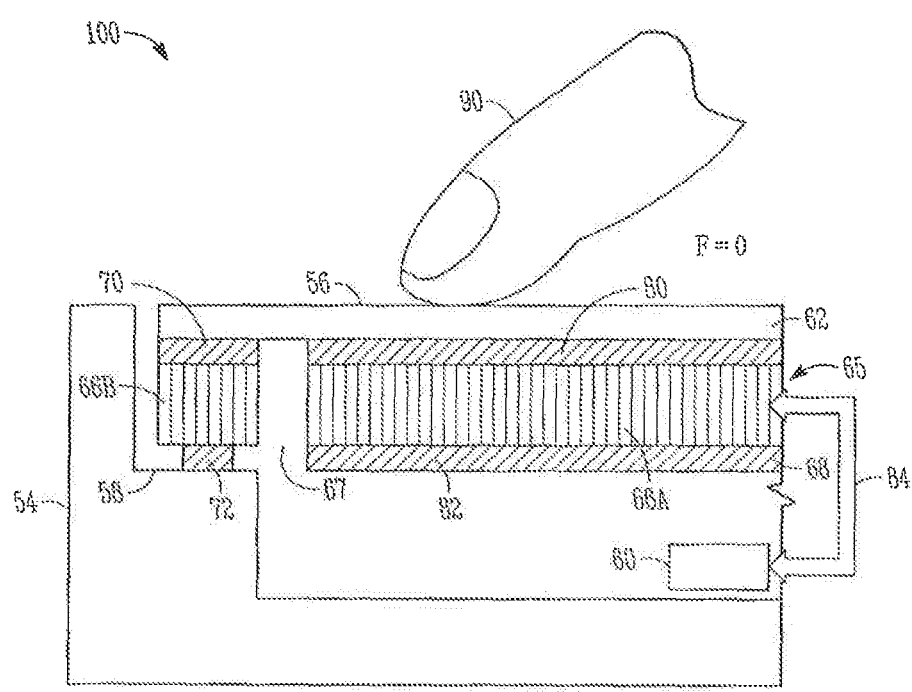
FIG. 8 schematically shows a partial section view a device incorporating a capacitive sensor according to another embodiment.
Figure 9:
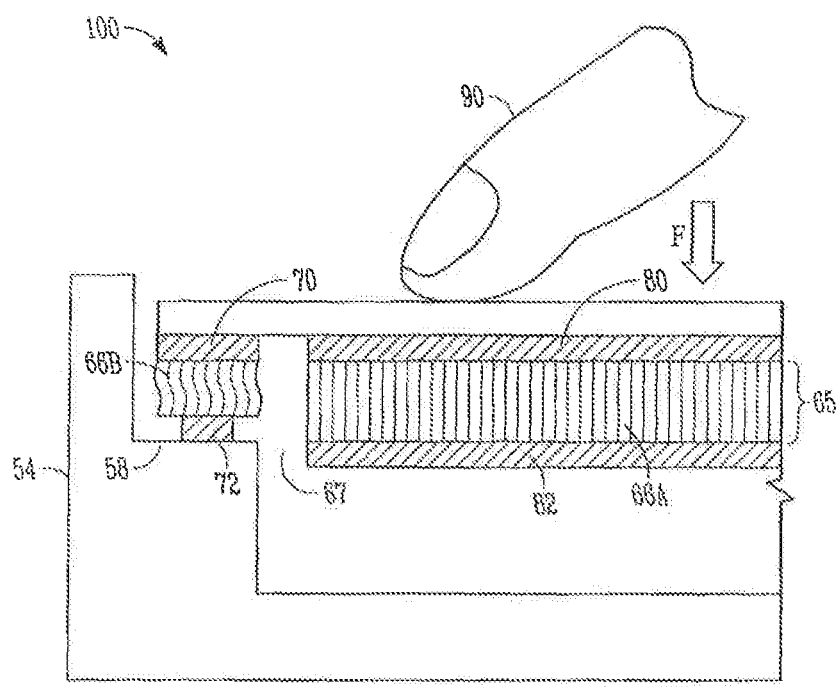
FIG. 9 schematically shows a partial section view of the device shown in FIG. 8 under load from a finger pressing on the capacitive sensor of the device.

FIGS. 8 and 9 are similar to and will be understood from FIGS. 5 and 7 respectively. However, FIGS. 8 and 9 show a control panel 100 according to another embodiment. Aspects of the control panel 100 of FIGS. 8 and 9 which are similar to and will be understood from the control panel 52 of FIGS. 5 and 7 are indicated by the same reference numerals and are not described further in the interest of brevity. The control panel 100 of FIGS. 8 and 9 differs from the control panel 52 of FIGS. 5 and 7 in the design of its dielectric substrate and the second electrode layer. In particular, these elements in the control panel 52 of FIGS. 5 and 7 are continuous layers, but in the control panel 100 of Figures B and 9 the corresponding elements comprise separated portions.

Thus control panel 100 comprises a dielectric substrate comprising separate portions, namely a compressible force sensor portion 66B and a touch sensor portion 66A. These are separated all around by a gap 67. In practice this may be achieved by starting with a continuous dielectric layer and removing part of it to create the gap. Thus the force sensor portion 66B and the touch sensor portion 66A of the dielectric substrate may be formed of the same material. However in other examples these two portions may comprise separate materials that which are separately assembled during construction of the sensing element in accordance with known techniques for fabricating layered/laminated structures. If the touch sensor aspect of the design is based on passive (selfcapacitance) sensing techniques (such as described further below), there need not be touch sensor electrodes in the second electrode layer, and in this case there would be no need to include a portion of dielectric substrate in the touch sensing region of the control panel.

Similarly, the second electrode layer of the control panel 100 comprises separate portions, namely a force sensor portion (comprising the second force sensor electrode 72) and a touch sensor portion (comprising the second touch sensor electrode 82). The force and touch sensor electrodes in the second electrode layer themselves may be generally similar to those of the control panel 52 of FIGS. 5 and 7. As with the two dielectric substrate portions 66A, 66B of the control panel 100 of FIGS. 8 and 9, the two second electrode layer portions may be provided by removing part of an initially continuous electrode layer, or may comprise separately assembled layers, e.g., individual appropriately shaped PET sheets with ITO deposition.

FIG. 8 schematically shows the control panel 100 in a state in which a pointing object 90 (here a user's finger) is proximate the sensor, but is not applying any pressing force (F=0). Here the touch sensor aspect of the control panel will provide a touch sensor output signal indicative of the proximity of the object, e.g., indicative of its position (depending on the functionality of the touch sensor aspect of the control panel), while the force sensor aspect of the control panel will provide a force sensor output signal indicative of no force being applied.

FIG. 9, on the other hand, schematically shows the control panel 100 in a state in which the pointing object 90 is applying a pressing force F. Here the touch sensor aspect of the control panel will provide a touch sensor output signal indicative of the proximity of the object, e.g., indicative of its position (depending on the functionality of the touch sensor aspect of the control panel), while the force sensor aspect of the control panel will provide a force sensor output signal indicative of the force F being applied.

The significance of the gap 67 between the respective portions of the dielectric substrate and second electrode layer in the control panel 100 of FIGS. 8 and 9 is that it can help reduce the transfer compression forces between the force sensor electrodes to a region of the dielectric substrate between the touch electrodes. This effect is schematically illustrated in FIG. 7 in the region identified by reference numeral 110. Here the compression of the dielectric substrate 66 caused by the applied force F is primarily between the first and second force sensor electrodes, since these are aligned with the support location provided by the lip in the housing. However, in some cases, depending on how close the touch sensor electrodes are to the force sensor electrodes, and also the mechanical properties of the dielectric substrate, there is a possibility of some deformation of the dielectric substrate in a region between the touch sensor electrodes occurring, as schematically indicated in region identified by reference numeral 110 in FIG. 7. This effect can be reduced by providing a gap (or a partial gap) such as shown in FIG. 8 to help mechanically isolate the portion from the portion 66A of the dielectric substrate in the region between the touch sensor electrodes from the portion 66B in the region between the force sensor electrodes. Thus as shown in FIG. 9, an applied force F causes the portion 66B of the dielectric substrate in the region between the force sensor electrodes to compress without affecting the separation of the touch sensor electrodes 80, 82. A change in separation of the touch sensor electrodes caused by the force F (such as shown in FIG. 7 in region 110) changes their mutual capacitance, and so can interfere with the normal operation of the touch sensor aspect of the control panel The gap 67 can help to reduce this effect in cases where it is a concern.

In a variant to the design shown in FIGS. 8 and 9, in other embodiments a continuous dielectric layer similar to that shown in FIGS. 5 and 7 may be used, but with a region of reduced thickness between the force and touch sensor electrodes (i.e., in a region corresponding to the location of the gap 67 shown in FIG. 8). This can also help in mechanically isolating the dielectric substrate between the touch sensor electrode; from compression of the dielectric substrate between the force and touch sensor electrodes. It with be appreciated a region of the dielectric substrate between the force and sense electrodes having reduced (including zero) thickness need not extend continuously along the full extent of a region between the force and sense electrodes, but could instead extend along only a portion of the region between the force and touch electrodes. For example, the region of reduced thickness might comprise one or more holes or slots in the dielectric substrate arranged to reduce the thickness at selected locations between the force and touch sensor electrodes. In some embodiments this can provide a structure that is simpler to handle, for example during assembly, but which provides a desired level of mechanical isolation between a region of the substrate between the force sensor electrodes and a region of the substrate between the touch sensor electrodes.

It will be appreciated the above-described principles are applicable to many different overall designs. For example, it is not necessary for the force sensor electrodes to be at an edge of the sensing element. With an appropriately located support, the force sensor could be anywhere.

Figure 10:
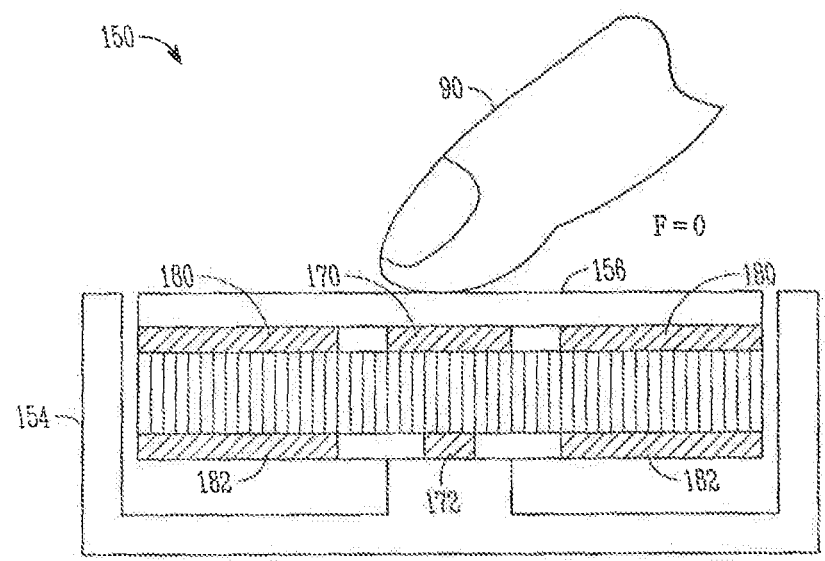
FIG. 10 schematically shows a section view a device incorporating a capacitive sensor according to another embodiment.
Figure 11:
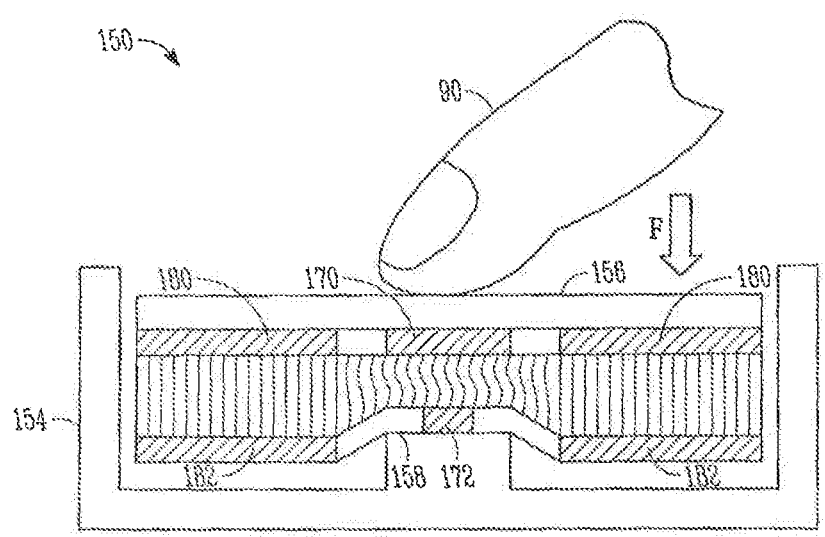
FIG. 11 schematically shows a section view of the device shown in FIG. 8 under load from a finger pressing on the capacitive sensor of the device.

For example, FIGS. 10 and 11 are similar to and will be understood from FIGS. 5 and 7 respectively. However, FIGS. 10 and 11 show a control panel 150 according to another embodiment. Aspects of the control panel 150 of FIGS. 10 and 11 which are similar to and will be understood from the control panel 52 of FIGS. 5 and 7 are not described further in the interest of brevity. However, the control panel 150 of FIGS. 10 and 11 differs from the control panel 52 of FIGS. 5 and 7 in that it has force sensor electrodes 170, 172 at central location of a sensing element 156, and touch sensor electrodes 18Q, 182 at a peripheral location. A housing 154 of a device in which the control panel 150 is incorporated is arranged to provide support for the sensing element 156 at a central support location 158 aligned with the force sensor electrodes 170, 172. Apart from the re-arrangement of the electrodes and support location, the control panel 150 of FIGS. 10 and 11 otherwise operates in the same general manner as describe above for the control panels 52, 100 of the other embodiments. However, when a pushing force F is applied the dielectric substrate compression occurs at the central location of the force sensor electrodes, rather than at their peripheral location in the previously-described control panels 52, 100.

Figure 12:
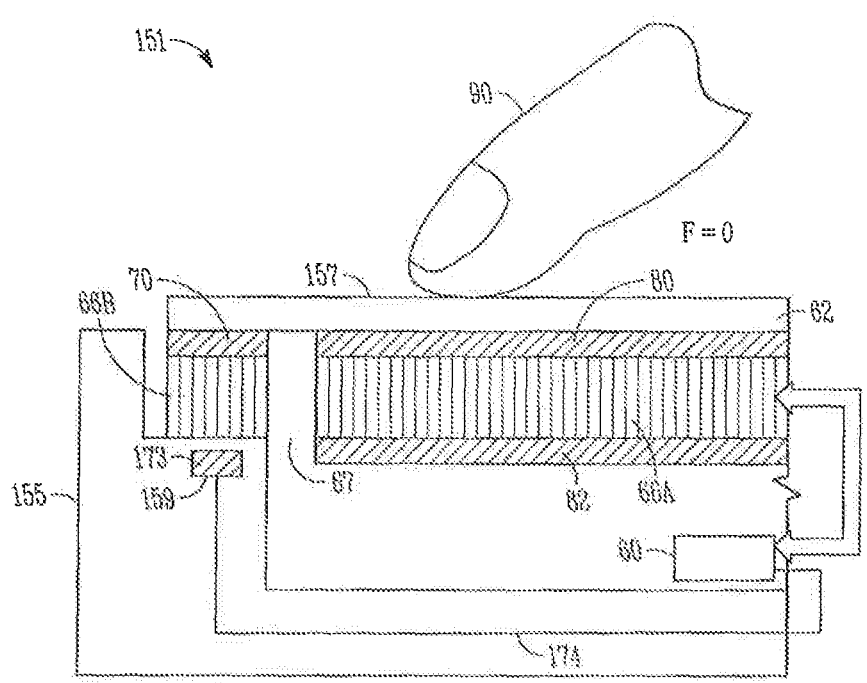
FIG. 12 schematically shows a section view a device incorporating a capacitive sensor according to another embodiment.

FIG. 12 is similar to and will be understood from FIG. 8 but shows a control panel 150 according to another embodiment. Aspects of the control panel 150 of FIG. 12 which are similar to and will be understood from the control panel 100 of FIGS. 8 and 9 are indicated by the same reference numerals and are not described further in the interest of brevity. The control panel 150 of FIG. 12 differs from the control panel 100 of FIGS. 8 and 9 in the placement of its second force sensor electrode. The second force sensor electrode 72 of the control panel 100 of FIGS. 8 and 9 is mounted directly to the underside of the compressible dielectric substrate. However, the control panel 150 of FIG. 12 instead comprises a second force sensor electrode 173 in the form of a conductor, e.g., a copper wire, that is embedded within a housing 155 of the device into which the control panel 150 is incorporated. The second force sensor electrode 173 is connected to controller 60 via a trace 174, e.g., a conventional flying lead conductor coupled to an exposed part of the second force sensor electrode 173. The second force sensor electrode 173 in FIG. 12 is shown fully embedded in the housing such that there is in effect an additional region of dielectric material (i.e., a part of the housing 155) between the first and second force sensor electrodes. In other example the second force sensor electrode may be partially embedded in the housing, e.g., in a recessed channel A support structure 158 of the control panel 150 of FIG. 12 is thus provided by a portion of the housing beneath the second force sensor electrode 173. Overall it will be appreciated that the control panel 150 of FIG. 12 functions in an analogous manner to that of the control panel of FIGS. 8 and 9. The only difference is in the structural assembly for the various elements and there is no significant functional difference in how the two different designs may be operated. In this regard it will be appreciated that terms such as second electrode layer as applied to embodiments such as that shown in FIG. 12 do not require that the electrodes comprising the second electrode layer are coupled together in a unitary element prior to construction, only that they are functionally arranged as a layer on the same side of the compressible substrate (and may be physically offset from one another in being different distances from the substrate).

In some embodiments there may be multiple separate force sensors. For example, a sensing element may be supported at three locations, e.g., at the vertices of a triangle, or at the corners of a rectangle (e.g., at the corners of a generally rectangular user interface). In such cases an independent pairing of drive and sense force sensor electrodes may be provided at each location with appropriate regions of compressible dielectric material between them. In other examples at least some of the multiple drive and sense force sensor electrodes may be coupled together, or a single electrode of suitable extent may be used. For example, in an embodiment having four force sensors in a control panel which is otherwise broadly in accordance with that shown in FIGS. 4 to 7, a similar force sensor drive electrode to the force sensor drive electrode 70 shown in FIG. 6A may be used, but with multiple separated three sensor sense electrodes on the other side of the substrate replacing the single force sensor sense electrode 72 of the embodiment shown in FIG. 6A. For example, the tour force sensor sense electrodes may be provided beneath corner portions of the force sensor drive electrode such that four separate force measurements may be made.

Such multiple force measurements can be used, for example, to provide independent force sensors (e.g., to increase the number of "buttons" of the user interface), or to distinguish (triangulate) the location of a press on the cover panel. (Although in a case where the touch sensor aspect of the design provides position sensitivity, the location of an object applying a force could also be derived from the touch sensor output signal at the time the force sensor output signal indicates a force is being applied.)

It will also be appreciated that other kinds of capacitive sensing technology may be employed in different embodiments. For example, whereas the above described embodiments are based on mutual-capacitance drive and sense channel implementations (active capacitive sensing), other embodiments may be based on self-capacitance single sense channel implementations (passive capacitive sensing). For example, the touch sensor functionality may be provided using a single touch electrode (or multiple touch electrodes) whose self-capacitance(s) to a system reference potential (ground) is measured by a conventional self-capacitance capacitive sense channel. The touch electrode might only be in one or other of the electrode layers. The force sensor electrode may be provided by first and second force sensor electrodes similar to those described above, but with the second force sensor electrode coupled to a force sensor channel arranged to measure its capacitance(s) to ground, and the first force sensor electrode (:i.e., the one on the Object-facing side of the sensing element) coupled directly to ground (or other system reference potential). Thus as the first and second electrodes are brought together under the application of a touch, the capacitance of the second force sensor electrode to ground increases because of the increased proximity of the first force sensor electrode, so providing sensitivity to force. However, because the first force sensor electrode is on the object facing side of the sensing element and is connected to fixed potential it acts to screen the second sense electrode from the proximity of objects over the cover panel which are not applying a force. Thus in a manner similar to that described above, the force sensor is made less sensitive to the presence of non-pressing objects than might otherwise be the case.

It will be appreciated that while the dielectric substrate in the above example is compressible over its full extent, this is only for ease of manufacture since a single layer may be used to space the three sensor electrodes and the touch sensor electrodes. However, the portion of the dielectric substrate between the touch sensor electrodes need not be compressible. For example, referring to FIG. 8, the right hand portion 66A of the dielectric substrate for the orientation shown in the figure could equally be formed of a non-compressible dielectric material e.g., any conventional rigid material that might be used in capacitive touch screen construction.

Embodiments may thus be used to provide touch sensor and force sensor output signals. The use of these output signals will depend on the application at hand. For example, in a text entry mode of a device in which a control panel according to an embodiment is incorporated, the position of a finger over a displayed keyboard (as determined from the touch sensor output signal in accordance with known techniques) may be used to select a character for entry, and the magnitude of a force may be used to determine the mode of entry, e.g., a light tap (i.e., below a pre-defined force threshold) might be used to indicate entry of a lower-case letter, while a hard press (providing a force indication above the threshold signal) might be used to indicate entry of an upper-case letter. Generally speaking the nature of the use of the output signals from control panels according to embodiments can vary, and the signals may be used in any appropriate manner, for the application at hand.

It will be appreciated that the principles described above are applicable to control panels for use in many types of device/appliance. For example, sensors in accordance with embodiments can be employed in any situation where a user interface may be provided, for example in ovens, grills, washing machines, tumble-dryers, dish-washers, microwave ovens, food blenders, bread makers, drinks machines, computers, home audio-visual equipment, portable media players, PDAs, cell phones, computers, satellite navigation systems, vehicle control panels, and so forth. It is also possible to provide a control panel similar to the kinds described above which is provided separately from a device/appliance which it may be used to control. For example to provide an upgrade to a pre-existing appliance. It is also possible to provide a generic sensor which may be configured to operate a range of different appliances.

What is claimed is:

1. An apparatus, comprising:
    a first force sensor electrode configured within a first electrode layer;
    a second force sensor electrode configured within a second electrode layer; and
    a touch sensor electrode configured laterally to the first force sensor electrode within the first electrode layer or to the second force sensor electrode within the second electrode layer; and
    a dielectric substrate layer configured between the first electrode layer and the second electrode layer such that a distance between at least a portion of the first electrode layer and at least a portion of the second electrode layer changes based on a force applied by an object to a cover layer.

2. The apparatus of claim 1, further comprising a touch screen controller operable to:
    measure a first capacitance of the second force sensor electrode to sense the force applied by the object; and
    measure a second capacitance of the first touch sensor electrode to sense the proximity of the object.

3. The apparatus of claim 1, wherein the first electrode layer is positioned between the dielectric substrate layer and a cover layer.

4. The apparatus of claim 1, wherein the dielectric substrate layer is at least partially compressible.

5. The apparatus of claim 4, wherein the partially compressible portion of the dielectric substrate layer is arranged along a perimeter of a device housing the apparatus, wherein the dielectric substrate layer is supported by a lip in the device that runs along the perimeter.

6. The apparatus of claim 1, wherein the first touch sensor electrode positioned is adjacent to the first force sensor electrode or the second force sensor electrode within one of the first electrode layer and the second electrode layer and is spaced apart from the force sensor electrodes and a compressible portion of the dielectric substrate.

7. The apparatus of claim 1, further comprising a support location configured beneath the first and second force sensor electrodes and a compressible portion of the dielectric substrate so that a separation of the first and second force sensor electrodes depends on the magnitude of a force applied to the cover layer and so that at least a portion of the cover layer, the first electrode layer, and the second electrode layer extend laterally farther than the support location.

8. A system, comprising:
    a touch screen device;
    a touch screen controller coupled to the touch screen device; and
    a touch element comprising:

a first force sensor electrode configured within a first electrode layer;

a second force sensor electrode configured within a second electrode layer; and a touch sensor electrode configured within the first electrode layer or the second electrode layer; and a dielectric substrate layer configured between the first electrode layer and the second electrode layer such that a distance between at least a portiOn of the first electrode layer and at least a portion of the second electrode layer changes based on a force applied by an object to a cover layer; and wherein the touch screen device comprises a support location configured beneath a compressible portion of the dielectric substrate so that at least a portion of the first electrode layer and the second electrode layer extend laterally farther than the support location.

9. The system of claim 8, wherein the touch sensor electrode is configured laterally to the first force sensor electrode within the first electrode layer or to the second force sensor electrode within the second electrode layer.

10. The system of claim 8, wherein the touch screen controller is operable to:

measure a first capacitance of the second force sensor electrode to sense the force applied by the object; and measure a second capacitance of the first touch sensor electrode to sense the proximity of the object.

11. The system of claim 8, wherein the first electrode layer is positioned between the dielectric substrate layer and a cover layer.

12. The system of claim 8, wherein the compressible portion of the dielectric substrate layer is arranged along a perimeter of the touch screen device, wherein the dielectric substrate layer is supported by a lip in the touch screen device that comprises the support location and that runs along the perimeter.

13. The system of claim 8, wherein the first touch sensor electrode positioned is adjacent to the first force sensor electrode or the second force sensor electrode within one of the first electrode layer and the second electrode layer and is spaced apart from the force sensor electrodes and a compressible portion of the dielectric substrate.

14. The system of claim 8, wherein the dielectric layer compresses in response to force substantially only at the support location.

15. A method, comprising:

configuring a first force sensor electrode within a first electrode layer;

configuring a second force sensor electrode within a second electrode layer; and providing a touch sensor electrode that is lateral to the first force sensor electrode within the first electrode layer or to the second force sensor electrode within the second electrode layer; and configuring a dielectric substrate layer between the first electrode layer and the second electrode layer such that a distance between at least a portion of the first electrode layer and at least a portion of the second electrode layer changes based on a force applied by an object to a cover layer.

16. The method of claim 15, further comprising:

measuring, by a touch sensor controller, a first capacitance of the second force sensor electrode to sense the force applied by the object; and measuring, by the touch sensor controller, a second capacitance of the first touch sensor electrode to sense the proximity of the object.

17. The method of claim 15, wherein the first electrode layer is positioned between the dielectric substrate layer and a cover layer.

18. The method of claim 15, wherein the dielectric substrate layer is at least partially compressible.

19. The method of claim 15, wherein the compressible portion of the dielectric substrate layer is arranged along a perimeter of a touch screen device and the dielectric substrate layer is supported by a lip in the touch screen device that runs along the perimeter.

20. The method of claim 15, further comprising:

configuring the dielectric substrate layer to be mounted to a support location, wherein the dielectric substrate layer is substantially compressible only at the support location.

* * * * *

UNITED STATES PATENT AND TRADEMARK OFFICE
CERTIFICATE OF CORRECTION

PATENT NO. : 9,563,317 B2  
APPLICATION NO. : 14/278864  
DATED : February 7, 2017  
INVENTOR(S) : Sleeman et al.

Page 1 of 1

It is certified that error appears in the above-identified patent and that said Letters Patent is hereby corrected as shown below:

In the Claims

Column 15, Line 9: After "least a" and before "of the" please delete "portiOn." and insert -- portion --.

Signed and Sealed this  
Twenty-seventh Day of June, 2017

Joseph Matal  
*Performing the Functions and Duties of the*  
*Under Secretary of Commerce for Intellectual Property and*  
*Director of the United States Patent and Trademark Office*